(12) United States Patent
McCullough et al.

(10) Patent No.: US 7,671,173 B2
(45) Date of Patent: Mar. 2, 2010

(54) PURIFICATION METHODS AND PURIFIED POLYMERS

(75) Inventors: Richard D. McCullough, Pittsburgh, PA (US); Mihaela C. Iovu, Dallas, TX (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 11/849,220

(22) Filed: Aug. 31, 2007

(65) Prior Publication Data

US 2008/0132670 A1      Jun. 5, 2008

Related U.S. Application Data

(60) Provisional application No. 60/841,550, filed on Sep. 1, 2006.

(51) Int. Cl.
*C08F 6/00* (2006.01)
(52) U.S. Cl. .................. 528/491; 528/480; 528/482; 252/500; 210/638; 210/688
(58) Field of Classification Search .................. 252/500; 210/638, 688; 528/229, 272, 480, 487, 482, 528/491
See application file for complete search history.

(56) References Cited

U.S. PATENT DOCUMENTS 4,595,749 A      6/1986   Hoxmeier
6,602,974 B1 *   8/2003   McCullough et al. ......... 528/73
2004/0250849 A1  12/2004  Chen et al.
2004/0254336 A1  12/2004  Xiao et al.

OTHER PUBLICATIONS

PCT/US2007/077456, filed Aug. 31, 2007, International Search Report, (dated Jun. 4, 2008) (4 pages).
Marsitzky, D., "Funktionalisierung von Konjugierten Polymeren auf der Basis von PPP: Synthese und Charakterisierung von kojugierten Block- und statistischen Copolymeren zur Anwendung in lichtemittierenden Dioden" Verlag Mainz, Wissenschaftsverlag, Aachen, Mainz, XP-002481132, 5.Experimental Section, pp. 197-200 and 208-209 (2000).

* cited by examiner

*Primary Examiner*—Ling-Siu Choi
*Assistant Examiner*—Frances Tischler
(74) *Attorney, Agent, or Firm*—J. Steven Rutt; Foley & Lardner LLP

(57) ABSTRACT

Metal complexing agents are used to purify polymers including conducting polymers to provide very low metal content. The process comprises precipitating the polymer in solution into a solvent system comprising the metal complexing agent. Very low levels including undetectable levels of metals such as nickel and magnesium can be achieved. High purity polymers are used in electronics and photovoltaic applications.

25 Claims, 1 Drawing Sheet

US 7,671,173 B2

PURIFICATION METHODS AND PURIFIED POLYMERS

RELATED APPLICATIONS

This application claims the benefit of U.S. Provisional Application Ser. No. 60/841,550, filed Sep. 1, 2006, which is incorporated herein by reference in its entirety.

STATEMENT OF FEDERAL SUPPORT

The subject matter of this application was sponsored in part by the federal government under National Science Foundation grant no. NSF CHE 0415369, and the government has certain rights in the application.

BACKGROUND

Conducting polymers, or polymers that have conjugation in their backbone, can be used in many commercial applications including for example OLEDs, PLEDs, photovoltaic cells, transistors, sensors, and the like. See, for example, *The Encyclopedia of Polymer Science and Engineering*, Wiley, 1990, pages 298-300, including polyacetylene, poly(p-phenylene), poly(p-phenylene sulfide), polypyrrole, and polythiophene; see also U.S. Pat. Nos. 6,602,974 to McCullough et al. and 6,166,172 to McCullough et al., as well as "The Chemistry of Conducting Polythiophenes," by Richard D. McCullough, *Adv. Mater.* 1998, 10, No. 2, pages 93-116 and *Handbook of Conducting Polymers*, $2^{nd}$ Ed. 1998, Chapter 9, by McCullough et al., "Regioregular, Head-to-Tail Coupled Poly(3-alkylthiophene) and its Derivatives," pages 225-258. In many cases, commercial applications compel that these polymers be free of metallic impurities. For example, nickel and magnesium impurities represent typical problems. This can be a challenge however because large amounts of metals can be used in preparing these polymers including magnesium and nickel which may stubbornly persist in the material despite careful workup. Conducting polymers can aggregate and trap impurities, and solubility can be difficult. However, extensive purification can be economically unattractive. Metallic impurities can alter and reduce properties and generally generate confusion in data interpretation. In many cases, one should note the purification methods used for preparing the polymer in reporting the properties of the polymer or devices using the polymer. See for example US Patent Publication 2004/0250849 to Chen et al.; Erwin et al, "Effects of Impurities on the Optical Properties of Poly-3-hexylthiophene Thin Films," Thin Solid Films, 409 (2002) 198-205. Problems of metallic impurities are particularly relevant to development of polythiophenes and regioregular polythiophenes.

A general need exists to find a versatile, inexpensive, convenient, commercially attractive method to purify polymers, particularly for electronic applications and those involving electric current flow, fields, and interaction with light. The polymers should be electronics grade: high quality and high purity enabling high mobility performance. Relevant applications include organic electronic applications including RFID chips, solar cells, FETs, OLEDs, and PLEDs. Commercial scale should be possible with multi-kg batches. For example, a need exists to prepare polymers for both bench work and at commercial scale wherein the total metal content is less than 50 ppm, the contents of magnesium and nickel are each undetectable, and the amount of iron is also reduced to below 50 ppm.

U.S. Pat. No. 6,894,145 provides one approach based on extraction.

SUMMARY

Provided herein are methods of purifying polymers, methods of using purified polymers, purified polymers, and devices made from purified polymers.

One embodiment provides a method comprising: (i) providing a first solution comprising a soluble conducting polymer and first solvent system, (ii) providing a second solution comprising at least one metal complexing agent and a second solvent system which is adapted to precipitate the conducting polymer, (iii) combining the first solution with the second solution to precipitate the conducting polymer, (iv) isolating the precipitated conducting polymer.

Another embodiment is a method comprising: providing a first solution comprising a soluble polythiophene, providing a second solution comprising at least one metal complexing agent, combining the first solution with the second solution to precipitate the polythiophene, and isolating the precipitated polythiophene.

Another embodiment is a method comprising: providing a first solution comprising a soluble regioregular polythiophene, providing a second solution comprising at least one metal complexing agent, combining the first solution with the second solution to precipitate the regioregular polythiophene, isolating the precipitated regioregular polythiophene.

Another embodiment is a method comprising: providing a first solution comprising a soluble conducting polymer and first solvent system, providing a second solution comprising (i) at least one agent which can undergo ligand exchange with a nickel phosphine compound and (ii) a second solvent system which is adapted to precipitate the conducting polymer, combining the first solution with the second solution to precipitate the conducting polymer, and isolating the precipitated conducting polymer.

Advantages of one or more of the embodiments described herein include better polymer properties and better performance when used in devices, more soluble polymers, better analytical data, and higher mobilities.

DETAILED DESCRIPTION

Introduction

Figure 1:
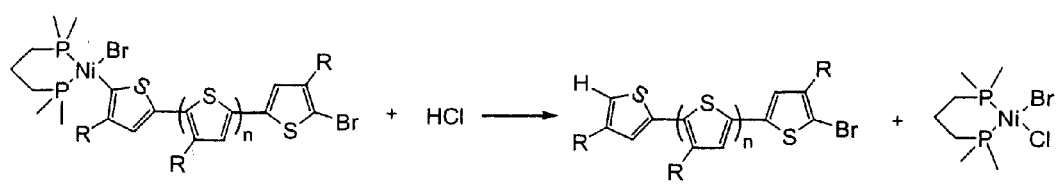
FIG. 1 illustrates nickel thiophene bond cleavage with HCl treatment for one metal containing polythiophene polymer in need of purification.

All references cited herein are hereby incorporated by reference in their entirety.

A first embodiment provides a method comprising:

providing a first solution comprising a soluble conducting polymer and first solvent system, providing a second solution comprising at least one metal complexing agent and a second solvent system which is adapted to precipitate the conducting polymer, combining the first solution with the second solution to precipitate the conducting polymer, isolating the precipitated conducting polymer.

Another embodiment provides the soluble conducting polymer as a heterocyclic polymer.

Yet another embodiment provides the soluble conducting polymer as a polythiophene.

Yet another embodiment provides the conducting polymer as a regioregular polythiophene or a block copolymer comprising a regioregular polythiophene.

Yet another embodiment provides the conducting polymer as a regioregular polythiophene homopolymer or copolymer.

Yet another embodiment provides the conducting polymer as a 3-substituted polythiophene.

Yet another embodiment provides the conducting polymer as a 3-alkyl or 3-alkoxy substituted polythiophene.

Another embodiment provides a further step of preparing the conducting polymer with use of nickel and magnesium compounds.

Yet another embodiment provides a further step of preparing the conducting polymer with use of Grignard metathesis polymerization.

Yet another embodiment provides a further step of preparing the conducting polymer by polymerization of a thiophene monomer.

Another embodiment provides that the first solvent system comprises at least one organic solvent.

Yet another embodiment provides that the first solvent system comprises at least one organic solvent and acid.

Yet another embodiment provides that the first solvent system comprises at least one etheric solvent.

Another embodiment provides that the first solution comprises nickel and magnesium total content before purification of at least 1,000 ppm.

Another embodiment provides that the second solution is not substantially water.

Another embodiment provides that the metal complexing agent comprises a chelating compound with at least two binding groups.

Yet another embodiment provides that the metal complexing agent comprises a chelating compound with at least two nitrogen binding groups.

Yet another embodiment provides that the metal complexing agent comprises a chelating compound comprising at least two oxime groups.

Yet another embodiment provides that the metal complexing agent comprises a glyoxime compound.

Yet another embodiment provides that the metal complexing agent comprises dimethylglyoxime.

Yet another embodiment provides that the metal complexing agent comprises a crown ether.

Yet another embodiment provides that the metal complexing agent comprises a compound comprising a plurality of oxygen atoms.

Yet another embodiment provides that the complexing agent comprises a polymer comprising a nitrogen atom.

Yet another embodiment provides that the complexing agent comprises a polymer comprising a nitrogen atom in the side group.

Yet another embodiment provides that the complexing agent comprises an acrylamide or pyridine functional group.

Another embodiment provides that the first solution comprises at least two metal complexing agents Another embodiment provides that the amount of the metal complexing agent is at least about 0.1 g/100 mL of second solution.

Yet another embodiment provides that the amount of the metal complexing agent is at least about 0.5 g/100 mL of second solution.

Yet another embodiment provides that the amount of the metal complexing agent is at least about 1.0 g/100 mL of second solution.

Another embodiment provides that the adding step is carried out at about 15° C. to about 40° C.

Another embodiment provides that after the adding step, stirring is carried out for at least one hour.

Another embodiment provides that the isolating step comprises filtration, extraction, and drying.

Another embodiment provides that the isolated polymer comprises no residual ash in elemental analysis.

Another embodiment provides that the isolated polymer provides an ICP-MS nickel analysis of less than 1 ppm.

Yet another embodiment provides that the isolated polymer provides an ICP-MS magnesium analysis of less than 1 ppm.

Yet another embodiment provides that the isolated polymer provides an ICP-MS magnesium analysis and an ICP-MS nickel analysis both less than 1 ppm.

Yet another embodiment provides that the isolated polymer provides an ICP-MS nickel or magnesium analysis of less than 20 ppm.

Yet another embodiment provides that the isolated polymer provides a total metal content of less than 50 ppm.

Another embodiment provides that the combining step is carried out only once prior to the isolating step.

Another embodiment provides there is no two-phase separation step, liquid extraction step, or solid extraction step prior to the isolating step.

A second embodiment provides a method comprising:
providing a first solution comprising a soluble polythiophene,
providing a second solution comprising at least one metal complexing agent,
combining the first solution with the second solution to precipitate the polythiophene,
isolating the precipitated polythiophene.

A third embodiment provides a method comprising:
providing a first solution comprising a soluble regioregular polythiophene,
providing a second solution comprising at least one metal complexing agent,
combining the first solution with the second solution to precipitate the regioregular polythiophene,
isolating the precipitated regioregular polythiophene.

A fourth embodiment provides a method comprising:
providing a first solution comprising a soluble conducting polymer and first solvent system,
providing a second solution comprising (i) at least one agent which can undergo ligand exchange with a nickel phosphine compound and (ii) a second solvent system which is adapted to precipitate the conducting polymer,
combining the first solution with the second solution to precipitate the conducting polymer,
isolating the precipitated conducting polymer.

Another embodiment provides a purified polymer prepared by the method according to the first, second, third, or fourth embodiments.

Yet another embodiment provides a device comprising the purified polymer prepared by the method according to the first, second, third, or fourth embodiments.

Another embodiment provides a soluble conducting polymer, wherein the total metal content of the soluble conducting polymer is about 50 ppm or less.

Yet another embodiment provides a soluble conducting polymer, wherein the total metal content of the soluble conducting polymer is about 50 ppm or less, and wherein the polymer is a soluble polythiophene.

Yet another embodiment provides a soluble conducting polymer, wherein the total metal content of the soluble conducting polymer is about 50 ppm or less, and wherein the polymer is a soluble regioregular polythiophene.

Another embodiment provides that the polymer of the first embodiment is a block copolymer.

Yet another embodiment provides that the polymer of the first embodiment is a block copolymer comprising a polythiophene segment.

Yet another embodiment provides that the polymer of the first embodiment provides no residual ash in elemental analysis.

Yet another embodiment provides that the polymer of the first embodiment provides an ICP-MS nickel analysis of less than 1 ppm.

Yet another embodiment provides that the polymer of the first embodiment provides an ICP-MS magnesium analysis of less than 1 ppm.

Yet another embodiment provides that the polymer of the first embodiment provides an ICP-MS magnesium and an ICP-MS nickel analysis each of less than 1 ppm.

Another embodiment provides a device comprising a purified polymer of a soluble conducting polymer, wherein the total metal content of the soluble conducting polymer is about 50 ppm or less.

First Solution

The first solution is adapted for dissolving the soluble conducting polymer and can comprise a first solvent system comprises one or more compounds in heterogeneous or homogeneous form.

Solvents for conducting polymers are known in the art and include organic solvents, aqueous solvents, and mixtures of solvents. In particular, ethers such as THF can be used. Solvents can be used which are used in ring opening metathesis polymerization reactions.

The first solution can be a solution which is taken from a polymer synthesis reaction including as needed one or more workup steps. If desired, the amount of solvent can be varied so for example the amount of solvent can be reduced by for example evaporation to concentrate the polymer before precipitation.

In particular, an acid work up step can be used to provide the first solution.

In some cases, the first solution may not be a true solution, but rather the polymer may form a dispersion which functions equivalently for purposes herein as a true solution and is considered herein as a true solution.

Soluble Conducting Polymer

Electrically conductive polymers, including soluble conducting polymers, are described in *The Encyclopedia of Polymer Science and Engineering*, Wiley, 1990, pages 298-300, including polyacetylene, poly(p-phenylene), poly(p-phenylene sulfide), polypyrrole, polythiophene, polyphenylene vinylene, and polyfluorenes, which is hereby incorporated by reference in its entirety. This reference also describes blending and copolymerization of polymers, including block copolymer formation. The soluble conducting polymer can be for example a heterocyclic polymer comprising polymerized rings, wherein a nitrogen or sulfur atom is in a ring as known in the art.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Soluble conducting polymers are known in the art. In many cases, a conjugated backbone structure is present which is functionalized or derivatized with side groups to provide solubility. For example, provisional patent application Ser. No. 60/612,641 filed Sep. 24, 2004 to Williams et al. ("HETEROATOMIC REGIOREGULAR POLY(3-SUBSTITUTEDTHIOPHENES) FOR PHOTOVOLTAIC CELLS") and U.S. application Ser. No. 11/234,373 filed Sep. 26, 2005 are hereby incorporated by reference in their entirety including the description of the polymers, the figures, and the claims.

In addition, provisional patent application Ser. No. 60/612,640 filed Sep. 24, 2004 to Williams et al. ("HETEROATOMIC REGIOREGULAR POLY(3-SUBSTITUTEDTHIOPHENES) FOR ELECTROLUMINESCENT DEVICES"), and U.S. Ser. No. 11/234,374 filed Sep. 26, 2005, are hereby incorporated by reference in their entirety including the description of the polymers, the figures, and the claims.

Provisional patent application Ser. No. 60/628,202 filed Nov. 17, 2004 to Williams et al. ("HETEROATOMIC REGIOREGULAR POLY(3-SUBSTITUTEDTHIOPHENES) AS THIN FILM CONDUCTORS IN DIODES WHICH ARE NOT LIGHT EMITTING") and U.S. application Ser. No. 11/274,918 filed Nov. 16, 2005 which are hereby incorporated by reference in their entirety including the description of the polymers, the figures, and the claims.

Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, $2^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polythiophenes are described, for example, in Roncali, J., *Chem. Rev.* 1992, 92, 711; Schopf et al., *Polythiophenes: Electrically Conductive Polymers*, Springer: Berlin, 1997.

Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and -($AB_n$-multiblock copolymers (chapter 7), which can form the basis of block copolymer types in the present invention.

Additional block copolymers including polythiophenes are described in, for example, Francois et al., *Synth. Met.* 1995, 69, 463-466, which is incorporated by reference in its entirety; Yang et al., *Macromolecules* 1993, 26, 1188-1190; Widawski et al., *Nature (London)*, vol. 369, Jun. 2, 1994, 387-389; Jenekhe et al., *Science*, 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804.

In one embodiment, the conducting polymer is a 3-substituted polythiophene. In another embodiment, the conducting polymer is a 3-alkyl or 3-alkoxy substituted polythiophene.

Polymers can be used which have narrow or broad molecular weight distributions, polydispersity index, such as for example 1.5 or less. Polymers can be prepared under living conditions which provide control over molecular weight. Weight average molecular weight can be for example about 5,000 to about 100,000 or about 5,000 to about 25,000.

In one embodiment, the purification method can comprise the step of preparing the conducting polymer with use of nickel and magnesium compounds.

In one embodiment, the purification method can comprise the step of preparing the conducting polymer with use of ring opening metathesis polymerization including grignard ring opening metathesis polymerization (GRIM).

In one embodiment, the purification method can comprise the step of preparing the conducting polymer by polymerization of a thiophene monomer.

If desired, at least two soluble conducting polymers, or mixtures thereof, can be used.

Polymers are generally used which are prepared with transition metals or metals generally or otherwise comprise undesired amounts of transition metals or metals generally including for example magnesium, nickel, palladium, and platinum.

Second Solution

The second solution can be adapted for polymer precipitation and can comprise a second solvent system. Solvents can be selected in which the polymer has little if any solubility and can be called non-solvents for the polymer or a nonsolvent in a precipitation context. Mixtures of non-solvents can be used. Solvents should be adapted to provide good solubility for the metal complexing agent. Alcohols such as methanol and ethanol can be used.

Metal Complexing Agent

The metal complexing agent is not particularly limited so long as it can dissolve in the second solvent system and bind with one or more metals in the polymer in need of purification. It can be a lower molecular weight compound, an oligomer, or a polymer. It can be a chelating compound comprising a plurality of binding groups such as two, three, four, five, or six binding groups. It can be a polymer having binding groups in the backbone or in the side group. The metal complexing agent can comprise carbon, hydrogen, and a heteroatom such as nitrogen or oxygen which provides polarity and Lewis base character. The metal complexing agent can provide for example coordinate bonding as is known in transition metal complexing.

In one embodiment, the metal complexing agent can be represented by:

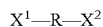

Wherein $X^1$ and $X^2$ can be the same or different and represent groups which can complex to metals. The spacer group R can help ensure that the two binding groups are in position to provide multiple binding to a single metal atom. For example, the R group can be a C2, C3, or C4 group. The R group can be further derivatized with groups such as alkyl such as methyl or ethyl. In one embodiment, X1 and X2 can be =N(OH).

In one embodiment, for example, the metal complexing agent comprises a chelating compound with at least two binding groups. In one embodiment, the metal complexing agent comprises a chelating compound with at least two nitrogen binding groups. In one embodiment, the metal complexing agent comprises a chelating compound comprising at least two oxime groups. In one embodiment, the metal complexing agent comprises a glyoxime compound. In one embodiment, the metal complexing agent comprises dimethylglyoxime.

In one embodiment, the metal complexing agent comprises a crown ether. Crown ether can be for example 18-crown-6 ether or 15-crown-5 ether to complex with for example potassium or sodium respectively. The size of the ether ring can be adjusted to complex with a particular metal. Other crown ethers can be used such as for example 18-crown-6 or 12-crown-4, as well as cryptans and host-guest types of complexing agents.

In one embodiment, the metal complexing agent comprises a compound comprising a plurality of oxygen atoms.

The metal complexing agent can be an oligomer or polymer. In one embodiment, the complexing agent comprises a polymer comprising a nitrogen or oxygen atom. In one embodiment, the complexing agent comprises a polymer comprising a nitrogen atom in the side group. In one embodiment, the complexing agent comprises an acrylamide or pyridine functional group. Examples include poly(N-isopropyl acrylamide) (PNIPAM) and poly(N-vinyl pyridine). Another example is an carboxylic acid containing polymer such as poly(acrylic acid).

In one embodiment, the second solution comprises at least two metal complexing agents.

A mixture of metal complexing agents can be used. In some cases, one complexing agent can be selected for a first metal, whereas a second complexing agent can be used for a second metal, and on and one with additional metal complexing agents.

Simultaneous or sequential methods can be used with multiple complexing agents. Hence, the complexing agents can be mixed in one solvent system and all exposed to the polymer in one step. Or the polymer can be purified in a time sequential process of using multiple second solutions one at a time.

In another embodiment, the combining step mixing the first solution and the second solution is carried out only once to precipitate the conducting polymer before isolating the polymer.

In another embodiment, there is no two-phase separation step, liquid extraction step, or solid extraction step prior to isolating the polymer.

The amount or concentration of the complexing agent is not particularly limited so long as the metal impurity reduction to the desired level can be achieved. For example, one can consider how much of the complexing agent is the part that binds to the metal. For example, in one embodiment, the amount of the metal complexing agent is at least about 0.01 g/100 mL of second solution. For example, in one embodiment, the amount of the metal complexing agent is at least about 0.1 g/100 mL of second solution. In one embodiment, the amount of the metal complexing agent is at least about 0.5 g/100 mL of second solution. In one embodiment, the amount of the metal complexing agent is at least about 1.0 g/100 mL of second solution.

Figure 2:
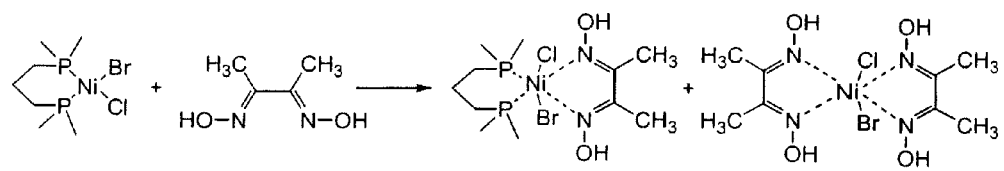
FIG. 2 illustrates ligand exchange of nickel phosphine catalyst for one metal complexing agent.

While the present embodiments are not to be limited by theory, FIGS. 1 and 2 help illustrate some reactions which may be relevant, particularly for polythiophene and regioregular polythiophene embodiments. In some cases, polythiophenes are prepared with use of nickel catalysts. In FIG. 1, polymer is shown having nickel complex at one end and HCl is shown to cleave the nickel catalyst from the polymer chain. This can provide a polymer free from the metal at the end group. For example, the end groups can be H and Br. In FIG. 2, the nickel complex then undergoes ligand exchange with the metal complexing agent.

Additional embodiments are provided:
1) Complexing agents for nickel which form nickel complex soluble in ethanol and methanol include dimethyl glyoxime, Eriochrome black T, potentate and tetradentate amines, bipyridine, and terpyridine;
2) Complexing agents for magnesium which form magnesium complex soluble in ethanol or methanol include crown ethers; aza crown ethers, and cryptands;
3) Complexing agents that form both nickel and magnesium complexes soluble in water include EDTA (ethylenediamine tetra-acetic acid), glycine, and nitriloacetic acid.
4) Complexing agents for iron removal (for example, from oxidative polymerization of 3-alkyl thiophene) include 1,10-phenanthroline, catechols and salicylic acid;

5) Polymeric complexing agents which are soluble in methanol and ethanol include poly(N-isopropyl acrylamide), poly(N-vinyl pyridine), and also polymeric complexing agents which are soluble in water include poly(acrylamide) and poly(vinyl alcohol).

| Complexing agent | Chemical formula |
|---|---|
| Dimethyl glyoxime | |
| Eriochrome Black T | |
| 15-crown-5 | |
| EDTA | |
| Glycine | |
| Nitriloacetic acid | |
| 1,10 Phenanthroline | |

-continued

| Complexing agent | Chemical formula |
|---|---|
| Catechol | (structure: benzene ring with two adjacent OH groups) |
| Salycilic acid | (structure: benzene ring with COOH and adjacent OH) |

One can select the amount of complexing agent to be in a large excess compared to the amounts of metal to be removed such as for example 3× excess or 10× excess.

The theoretical content of magnesium in polymer samples, before purification, can be for example about 10 wt. % to about 15 wt. %. After only conventional methanol extraction, the content of magnesium can be around 500-600 ppm. However, further cleaning with dimethyl glyoxime can reduce the magnesium content to about 150 ppm to about 200 ppm. Cleaning with 15-c-5 crown ether can reduce the magnesium content under the detection limit (less than 10 ppm).

The theoretical content of nickel in polymer, before purification, can be for example about 500 ppm to about 1,000 ppm (less nickel can be present when higher molecular weight polymers are designed). After only conventional methanol extraction, the content of nickel can be around 500 ppm to about 900 ppm (generally, only methanol extraction does not reduce much the nickel content). Cleaning with dimethyl glyoxime can reduce the nickel content under the detection limit (e.g., less than 10 ppm).

Magnesium salts can be more soluble in methanol and nickel salts can be much less soluble so that for a low nickel content, purification with a complexing agent is very important.

Adding Step

The polymer can be precipitated by adding the first solution to the second solution under experimental conditions such as temperature, concentration, stirring or agitation, and pour rate which facilitate precipitation of the polymer.

Particle size can be controlled to tailor the ease with which polymer can be isolated. For example, decreased particle size can result in more surface area and better purification for cleaning the polymer. However, this may make polymer isolation more difficult.

In one embodiment, the precipitation is performed only once.

Isolating Step

Methods known in the art can be used to isolate the polymer. These include for example filtration.

If desired, additional purification can be used such as extraction.

In one embodiment, there is no two-phase separation step, liquid extraction step, or solid extraction step prior to the isolating step.

Purified Polymer

Purification can be done faster according to the methods described herein. Larger amounts of polymer can be dissolved. The purified polymer can provide better solubility in organic solvents. As a result, for example, higher molecular weight polymers can be dissolved for a given solvent. The experimental conditions needed for solubilization can be much easier. Also, better analytical data can be obtained including for example mass spectral analysis such as MALDI-MS (matrix assisted laser desorption ionization).

The purified polymers can also provide better mobility and photovoltaic performance.

The purified polymer can be characterized to determine the metal content. In particular, contents of nickel and magnesium can be examined. Total metal content can be 50 ppm or less, or 40 ppm or less, or 30 ppm or less, or 20 ppm or less, or 10 ppm or less, or 1 ppm or less.

For example, in one embodiment, the isolated polymer comprises no residual ash in elemental analysis.

In another embodiment, the isolated polymer provides an ICP-MS nickel analysis of less than 1 ppm.

In another embodiment, the isolated polymer provides an ICP-MS magnesium analysis of less than 1 ppm.

In another embodiment, the isolated polymer provides an ICP-MS magnesium analysis and an ICP-MS nickel analysis both less than 1 ppm.

In another embodiment, the isolated polymer provides an ICP-MS nickel or magnesium analysis of less than 20 ppm.

In another embodiment, the isolated polymer provides an ICP-MS nickel or magnesium analysis of less than 10 ppm.

Applications and Devices

The purified polymers can show better optical and electrical properties. They can also provide better thermal and oxidative stability.

The polymers can be used for example in OLED, PLED, transistors, field effect transistors, photovoltaic cells, sensors, electrostatic dissipation coatings, and other devices for which conducting polymers have been used.

In particular, field effect transistors, hole injection layer and hole transport layer are important applications. Polymers having higher mobilities can be prepared.

Polymers can be formed into layers and used with electrodes and interlayers as known in the art.

Polymer blends can be prepared with other polymers.

WORKING EXAMPLES

Non-limiting working examples are also provided.

Working Example No. 1

Dimethylglyoxime

General Procedure for the Synthesis of Nickel Free Regioregular poly(3-hexylthiophene):

A dry 100 mL three-neck flask was flashed with nitrogen and was charged with 2,5-dibromo-3-hexylthiophene (9.8 g, 30 mmol) and anhydrous THF (300 mL). A 2M solution of t-butyl magnesium chloride (15 mL, 30 mmol) in diethyl ether ($Et_2O$) was added via a syringe, and the reaction mixture was gently refluxed for 60 min. The reaction mixture was allowed to cool down to room temperature, at which time Ni(dppp)$Cl_2$ (0.3 g, 0.54 mmol) was added to the reaction mixture. The polymerization was allowed to proceed for 20 min at room temperature followed by quenching of the reaction mixture with 3 ml HCl (37% wt) and 10 ml ethanol. After 5 min of stirring the solution was poured into a beaker containing 3 g of dimethyl glyoxime dissolved in 200 ml ethanol. The reaction mixture containing the precipitated polymer was stirred for 2 hours at room temperature, followed by filtering through a thimble. The polymer collected in the thimble was purified by Soxhlet extraction with ethanol for 4-8 hrs. The polymer was dried for 24 hrs under vacuum. The polymer was characterized by 1H NMR, MALDI-TOF-MS, elemental analysis and ICP-MS. Elemental analysis indicated the absence of ash (ash results from inorganic impurities such as magnesium and nickel salts). ICP-MS analysis of the purified polymer indicates the absence of nickel (Ni<1 ppm) and a content of magnesium between 50-200 ppm.

TABLE 1

Elemental analysis of regioregular poly(3-hexylthiophene) purified only by methanol extraction (PHT-MeOH) and purified with dimethylglyoxime (PHT-DMG)

| Elem. Analysis (C, H, S) | PHT-MeOH | PHT-DMG |
|---|---|---|
| C | 70.93 (71.1) | 70.73 (71.1) |
| H | 8.32 (8.3) | 8.34 (8.3) |
| S | 18.89 (19.0) | 18.17 (19.0) |
| Ash | 1.1 | none |

TABLE 2

Metal content of regioregular poly(3-hexylthiophene) purified only by methanol extraction (PHT-MeOH) and purified with dimethylglyoxime (PHT-DMG)

| Metal (ppm) | PHT-MeOH | PHT-DMG |
|---|---|---|
| Ni* | 747 | Not detected |
| Mg* | 539 | 182 |

*determined from ICP-MS analysis

Working Example No. 2

Crown Ether

General Procedure for the Synthesis of Nickel and Magnesium Free Regioregular poly(3-hexylthiophene):

A dry 100 mL three-neck flask was flashed with nitrogen and was charged with 2,5-dibromo-3-hexylthiophene (9.8 g, 30 mmol) and anhydrous THF (300 mL). A 2M solution of t-butyl magnesium chloride (15 mL, 30 mmol) in diethyl ether ($Et_2O$) was added via a syringe, and the reaction mixture was gently refluxed for 60 min. The reaction mixture was allowed to cool down to room temperature, at which time Ni(dppp)$Cl_2$ (0.3 g, 0.54 mmol) was added to the reaction mixture. The polymerization was allowed to proceed for 20 min at room temperature followed by quenching of the reaction mixture with 3 ml HCl (37% wt) and 10 ml ethanol. After 5 min of stirring the solution was poured into a beaker containing 3 g of dimethyl glyoxime (complexing agent for nickel) and 3 ml of 15-crown-5 (complexing agent for magnesium) dissolved in 200 ml ethanol. The reaction mixture containing the precipitated polymer was stirred for 2 hours at room temperature, followed by filtering through a thimble. The polymer collected in the thimble was purified by Soxhlet extraction with ethanol for 4-8 hrs. The polymer was dried for 24 hrs under vacuum. The polymer was characterized by $^1$H NMR, MALDI-TOF-MS, elemental analysis and ICP-MS. Elemental analysis indicated the absence of ash (ash results from inorganic impurities such as magnesium and nickel salts). ICP-MS analysis of the purified polymer indicates the absence of nickel and magnesium (Ni, Mg<1 ppm).

ICP-MS=Inductively Coupled Plasma Mass Spectrometry

Working Example No. 3

Polymer Complexing Agents

TABLE 3

ICP-MS of regioregular poly(3-hexylthiophene) upon purification with poly(N-isopropylacrylamide)

| Metal (ppm) | PHT-MeOH | PHT-PNIPAM |
|---|---|---|
| Ni | 760 | 5 |
| Mg | 550 | 20 |

What is claimed is:

1. A polymer purification method comprising:
   providing a first solution comprising a first solvent system and a conducting polymer, said conducting polymer being soluble in said first solvent system,
   providing a second solution comprising at least one metal complexing agent and a second solvent system which is adapted to precipitate the conducting polymer,
   combining the first solution to the second solution to form a precipitated conducting polymer,
   isolating the precipitated conducting polymer.

2. The method according to claim 1, wherein the soluble conducting polymer is a heterocyclic polymer.

3. The method according to claim 1, wherein the soluble conducting polymer is a polythiophene.

4. The method according to claim 1, wherein the conducting polymer is a regioregular polythiophene or a block copolymer comprising a regioregular polythiophene.

5. The method according to claim 1, wherein the conducting polymer is a 3-substituted polythiophene.

6. The method according to claim 1, further comprising the step of preparing the conducting polymer with use of nickel and magnesium compounds.

7. The method according to claim 1, further comprising the step of preparing the conducting polymer with use of Grignard metathesis polymerization.

8. The method according to claim 1, wherein the first solvent system comprises at least one organic solvent.

9. The method according to claim 1, wherein the first solution comprises nickel and magnesium total content before purification of at least 1,000 ppm.

10. The method according to claim 1, wherein the metal complexing agent comprises a chelating compound with at least two binding groups.

11. The method according to claim 1, wherein the metal complexing agent comprises a chelating compound with at least two nitrogen binding groups.

12. The method according to claim 1, wherein the metal complexing agent comprises a chelating compound comprising at least two oxime groups.

13. The method according to claim 1, wherein the metal complexing agent comprises a glyoxime compound.

14. The method according to claim 1, wherein the metal complexing agent comprises dimethylglyoxime.

15. The method according to claim 1, wherein the metal complexing agent comprises a crown ether.

16. The method according to claim 1, wherein the metal complexing agent comprises a compound comprising a plurality of oxygen atoms.

17. The method according to claim 1, wherein the complexing agent comprises a polymer comprising a nitrogen atom.

18. The method according to claim 1, wherein the amount of the metal complexing agent is at least about 0.1 g/100 mL of second solution.

19. The method according to claim 1, wherein the amount of the metal complexing agent is at least about 0.5 g/100 mL of second solution.

20. The method according to claim 1, wherein the isolated polymer comprises no residual ash in elemental analysis.

21. The method according to claim 1, wherein the isolated polymer provides an ICP-MS nickel analysis of less than 1 ppm.

22. A polymer purification method comprising:
providing a first solution comprising a soluble polythiophene,
providing a second solution comprising at least one metal complexing agent,
combining the first solution with the second solution to to form a precipitated polythiophene,
isolating the precipitated polythiophene.

23. A polymer purification method comprising:
providing a first solution comprising a soluble regioregular polythiophene,
providing a second solution comprising at least one metal complexing agent,
combining the first solution with the second solution to form a precipitated regioregular polythiophene,
isolating the precipitated regioregular polythiophene.

24. A polymer purification method comprising:
providing a first solution comprising a first solvent system and a conducting polymer, said conducting polymer being soluble in said first solvent system,
providing a second solution comprising (i) at least one agent which can undergo ligand exchange with a nickel phosphine compound and (ii) a second solvent system which is adapted to precipitate the conducting polymer,
combining the first solution with the second solution to form a precipitated conducting polymer,
isolating the precipitated conducting polymer.

25. A purified polymer prepared by the method according to claim 1.

* * * * *